(12) United States Patent
Trowell et al.

(10) Patent No.: US 7,999,546 B2
(45) Date of Patent: Aug. 16, 2011

(54) MR IMAGING MAGNET WITH BODY COIL ILLUMINATING THE IMAGING BORE

(75) Inventors: Stephen Paul Trowell, Alvingham (GB); Neil Charles Tigwell, Witney (GB)

(73) Assignee: Siemens PLC (GB)

(*) Notice: Subject to any disclaimer, the term of this patent is extended or adjusted under 35 U.S.C. 154(b) by 228 days.

(21) Appl. No.: 12/375,553

(22) PCT Filed: Jul. 4, 2007

(86) PCT No.: PCT/GB2007/050376
§ 371 (c)(1),
(2), (4) Date: Jan. 29, 2009

(87) PCT Pub. No.: WO2008/017879
PCT Pub. Date: Feb. 14, 2008

(65) Prior Publication Data
US 2009/0262551 A1    Oct. 22, 2009

(30) Foreign Application Priority Data
Aug. 7, 2006   (GB) .................................. 0615600.4

(51) Int. Cl.
*G01V 3/00* (2006.01)
(52) U.S. Cl. ......... 324/318; 324/307; 324/309; 324/322
(58) Field of Classification Search .......... 324/300–322; 600/410, 411, 422, 423; 333/219–235; 362/551, 362/253; 382/128–131
See application file for complete search history.

(56) References Cited

U.S. PATENT DOCUMENTS

| | | | | |
|---|---|---|---|---|
| 3,166,706 | A * | 1/1965 | Salvi et al. | 324/301 |
| 4,538,289 | A * | 8/1985 | Scheibengraber | 378/20 |
| 4,613,926 | A | 9/1986 | Heitman et al. | 362/32 |
| 4,629,989 | A * | 12/1986 | Riehl et al. | 324/318 |
| 5,355,885 | A | 10/1994 | Tsuda et al. | 600/410 |
| 6,049,208 | A * | 4/2000 | Takekoshi et al. | 324/319 |
| 6,294,915 | B1 * | 9/2001 | Murphy et al. | 324/319 |
| 7,274,192 | B2 * | 9/2007 | Havens | 324/318 |
| 7,343,191 | B1 * | 3/2008 | Damadian et al. | 600/410 |
| 2003/0128034 | A1 | 7/2003 | Haumann | 324/318 |
| 2005/0119559 | A1 | 6/2005 | Van Vaals et al. | 600/425 |
| 2009/0262551 | A1 * | 10/2009 | Trowell et al. | 362/551 |
| 2010/0308939 | A1 * | 12/2010 | Kurs | 333/219.2 |

FOREIGN PATENT DOCUMENTS

| | | |
|---|---|---|
| DE | 103 34 326 | 2/2005 |
| WO | WO 01/22108 | 3/2001 |

OTHER PUBLICATIONS

Patent Abstracts of Japan Publication No. 05146429.
Patent Abstracts of Japan Publication No. 03146029.

* cited by examiner

*Primary Examiner* — Melissa J Koval
*Assistant Examiner* — Tiffany A Fetzner
(74) *Attorney, Agent, or Firm* — Schiff Hardin LLP

(57) ABSTRACT

An imaging magnet has a patient bore for receiving a human or animal patient, including a body coil assembly having a body coil former and a body coil. The body coil assembly is provided with at least one source of light that is incorporated within the body coil assembly, and embedded within the body coil former, that radiates light into the patient bore.

16 Claims, 3 Drawing Sheets

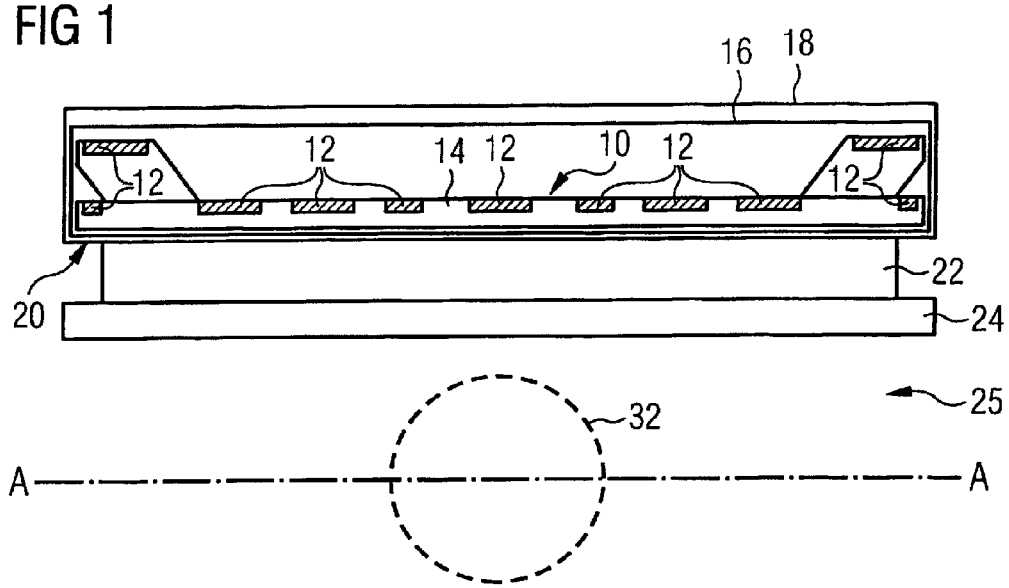
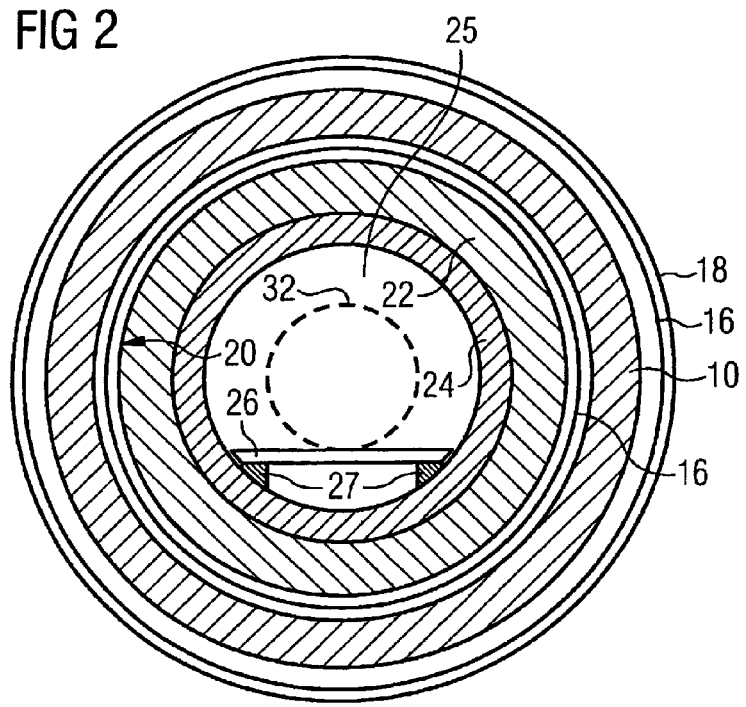

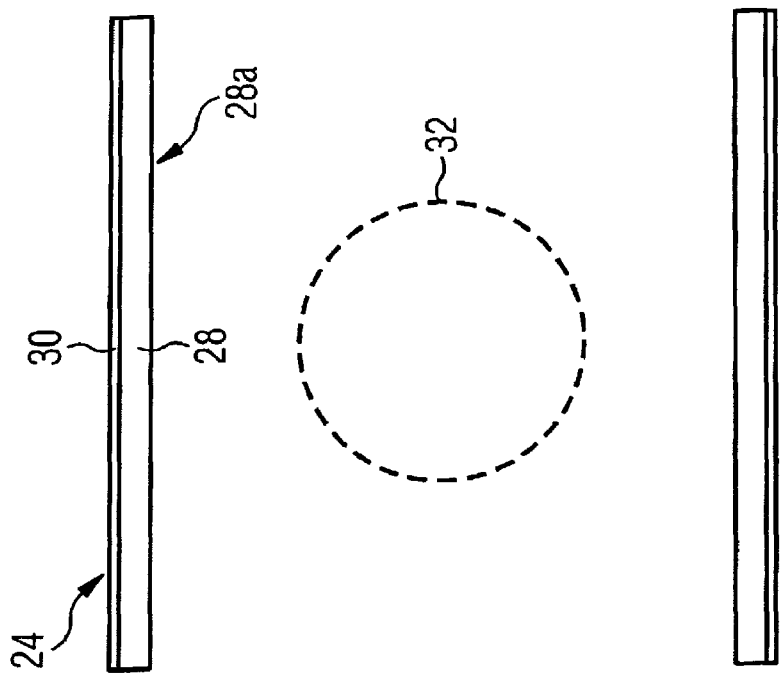
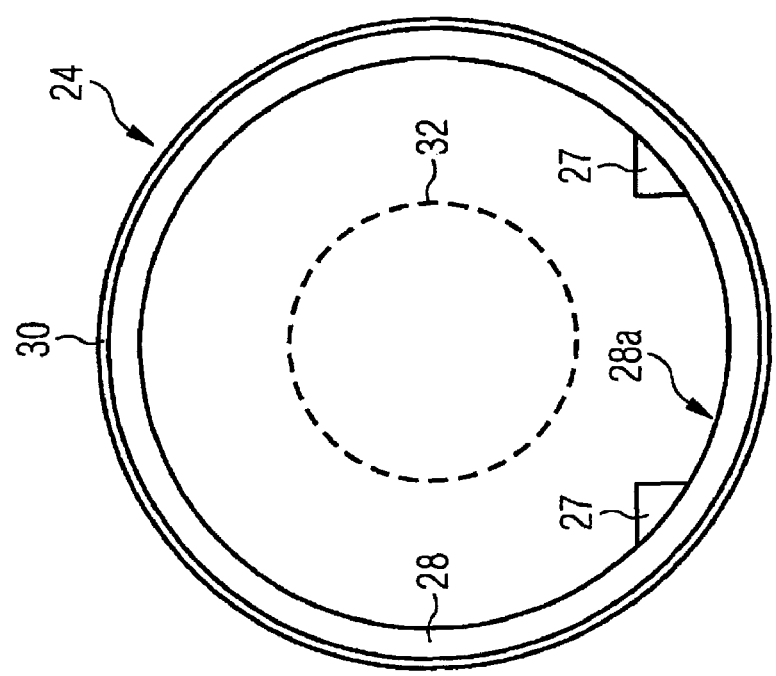

MR IMAGING MAGNET WITH BODY COIL ILLUMINATING THE IMAGING BORE

BACKGROUND OF THE INVENTION

1. Field of the Invention

The present invention relates to magnetic resonance imaging equipment, and in particular to a magnetic resonance imaging apparatus that reduces anxiety on the part of a patient undergoing a magnetic resonance imaging procedure.

2. Description of the Prior Art

Great expense and technical resources are applied to the problem of increasing the diameter of the patient-receiving bore in imaging magnets such as those used in Nuclear Magnetic Resonance (NMR) or magnetic resonance imaging (MRI), primarily to address the issues of patient comfort and acceptance of the procedure. An increase of 1 mm diameter of the patient bore is currently estimated to add to the cost of a magnet by GB£400 for a 3 T magnet, in wire cost alone (including overheads).

Discomfort and stress during imaging can lead to a number of problems, including:

- Movement of the patient causes image degradation to the extent that the sequence must be repeated, particularly common amongst elderly and child patients.
- Faster pulse rate and adrenalin release can make it difficult for patients to hold their breath for extended periods, important for chest/torso imaging.
- Ultimately, an uncomfortable experience can lead to refusal of the patient to enter the bore for repeat scans, with consequences for the patient, and for scan schedules.

In some situations, it has been found that patient rejection of imaging due to claustrophobia is a greater problem than actual inability to image due to obesity.

Accordingly, it is conventional that the patient bore is made as wide as reasonably possible, with due regard to final system cost. The maximized bore is then typically internally covered by "looks" covers, typically approximately 6 mm thick. The patient is received within an inner surface of the "looks" cover. The "looks" cover is provided to improve the aesthetic appearance of the bore as seen by a patient, and also offers thermal and acoustic insulation. However, it reduces the available the bore diameter by about 12 mm, in a typical solenoidal magnet arrangement using such covers.

FIG. 1 shows an axial half cross-section of a typical solenoidal MRI magnet arrangement, which is substantially cylindrical about axis A-A. Superconducting magnet 10 has a number of superconducting coils 12 wound onto a former 14. The magnet is housed within a cryogen vessel 16 and is cooled to temperatures at which superconductivity is possible by partial immersion in a cryogen such as liquid helium, or by any of the other methods known to those skilled in the art. An outer vacuum chamber 18 surrounds the cryogen vessel 16 and provides thermal isolation of the cryogen vessel 16. An inner cylindrical surface 20 of the outer vacuum container 18 is known as the warm bore. This warm bore houses gradient coil 22 and body coil assembly 24. A patient table must be provided within the body coil, and sufficient space must remain within the bore of the body coil to comfortably accommodate a patient in patient bore 25.

FIG. 2 shows a radial cross-section of the magnet system of FIG. 1. As illustrated, a patient bed 26 is partially supported 27 by the body coil assembly 24.

A 'looks' cover may be provided on the inner bore of the body coil assembly, to improve the appearance of the patient bore, as viewed by the patient. Alternatively, a surface treatment may be applied to the inner bore of the body coil assembly to provide an attractive appearance to the surface of the patient bore 25.

FIGS. 3A-3B show a typical body coil assembly 24 in more detail, in radial (FIG. 3A) and axial (FIG. 3B) cross-sections. A body coil former 28 is provided, typically cylindrical and composed of a glass-reinforced resin or other composite material. Other materials may of course be used for the body coil former, but the material chosen should be non-magnetic and of relatively low thermal conductivity. It is typically several millimeters thick. In certain known arrangements, it is about 6 mm thick. Coils of wire 30 are provided on the outer surface of the body coil former. In other known arrangements, the coils 30 are embedded within a structural material, such as a two-part resin, which retains the coils 30 and also serves as the body coil former.

It is the body coil former 28 which carries rails 27 for supporting patient table 26. The body coil former acts as a heat barrier between the coils 30 and the patient. For safety reasons, it is necessary to maintain a certain separation between the coils 30 and the patient. The body coil former 28 may therefore be relatively thick, for example, of 20 mm thickness.

In use, the superconducting magnet 10 provides a relatively high strength, homogenous magnetic field within an imaging region 32. Gradient coils 22 are typically resistive coils which provide a pulsed magnetic field, whose intensity varies, typically linearly, along the length of the bore of the magnet. The gradient coils serve to apply a precise intensity of magnetic field to a certain 'slice' of an imaged object, that 'slice' being at a certain axial position determined by the intensity and gradient of the magnetic field produced by the gradient coil. The body coil 24 operates to emit high frequency, typically radio frequency (RF) magnetic pulses, which establish resonance in certain atoms of the 'slice' of the imaged object, typically part of a human body.

The body coils 30 also act as an RF antenna, and pick up RF signals emitted by resonating atoms. These RF signals are typically analysed by computer so as to build up an image of the 'slice'.

The gradient coils typically consume large quantities of electrical power—tens of kilowatts—which is then dispersed as heat. Various arrangements, such as water cooling, are known to enable the removal of this heat.

Some conventional arrangements include flared bore ends to give the perception of a larger bore tube diameter. It has been proposed to improve the illumination of the patient bore, as increased illumination is believed to reduce a patient's feelings of confinement and reduce claustrophobia. One known solution comprises a woven arrangement of optic fibres, lit by either halogen or LED light sources, to deliver light in the bore tube. WO200122108-A1 provides lamps mounted at the patient's head as part of a communication assembly which further includes microphones, speakers, camera and a mirror. US2005119559-A1 includes adjustable LED light fans arranged in the vicinity of the imaging volume, to visualize the spatial position of imaging planes. US2003/128034-A1 provides a backlit display screen in the bore of an imaging magnet. DE10334326 describes dual-skinned looks covers, which may include light sources between the skins, and/or which may include certain combinations of transparent and translucent layers.

SUMMARY OF THE INVENTION

The present invention addresses the problem of patient perception of limited space, and provides improved imaging magnets, enabling improved images, as defined in the appended claims.

In accordance with one embodiment of the present invention, an imaging magnet has a patient bore for receiving a human or animal patient, with a body coil assembly that includes a body coil former and a body coil, with the body coil assembly being provided with at least one source of light that is incorporated within the body coil assembly to radiate light into the patient bore.

In another embodiment according to the present invention, an imaging magnet has a patient bore for receiving a human or animal patient, including a body coil assembly within the bore of the magnet so that the patient is received within the body coil assembly, and the body coil assembly has a body coil embedded in translucent material, with a source of light embedded in the translucent material.

BRIEF DESCRIPTION OF THE DRAWINGS

FIG. 1 illustrates an axial half-cross-section of a conventional imaging magnet.

FIG. 2 illustrates a radial cross-section of the imaging magnet of FIG. 1.

FIGS. 3A and 3B illustrate radial and axial cross-sections, respectively, of a conventional body coil assembly.

DESCRIPTION OF THE PREFERRED EMBODIMENTS

Figure 4:
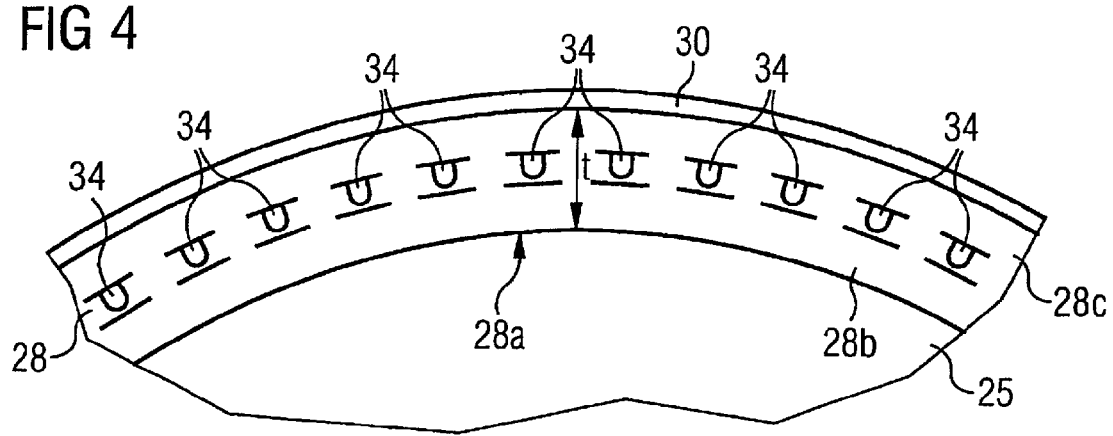
FIGS. 4 and 5 each illustrate a body coil assembly, according to an embodiment of the present invention, for use in an imaging magnet similar to that illustrated in FIG. 1.

The present invention provides an imaging magnet having a bore for receiving a human or animal patient, wherein the magnet is provided with at least one source of light integrated into the body coil assembly, located between the magnet and the patient. Preferably, the source of light provides diffuse light.

The imaging magnets of the present invention preferably provide even, soft illumination of the entire patient bore.

According to the present invention, one or more light sources are provided within the body coil assembly 24. In certain embodiments, the light source(s) is/are embedded within the material of the body coil former.

By providing a light source within the body coil assembly 24, light may be introduced into the patient bore, so as to relieve a patient's feelings of confinement, without consuming any of the restricted space within the patient bore in providing the light source.

According to an aspect of the present invention, soft uniform lighting is employed within the confined space of the bore tube to help to overcome patients' claustrophobia. This, combined with the use of light emitting surfaces, rather than purely light reflecting surfaces, increases the patient's perception of space available within the bore, and is believed to significantly reduce patient stress levels, improve imaging and incidentally enhance the general appearance of the imaging system. According to the present invention, at least one light source is provided within a body coil assembly to provide light into a patient bore.

Previous known designs have utilised fibre optics to transmit light from external sources into the bore (e.g. JP 3146029, U.S. Pat. No. 5,355,885, U.S. Pat. No. 4,613,926); or have utilised lamps or other displays in the bore for use in patient communication (e.g. U.S. Pat. No. 5,355,885, JP5146423) and for display of imaging planes on the patient (e.g. US2005/119559). None of the above designs includes diffuse light sources integrated into the body coil assembly for purposes of maximizing apparent bore dimensions. Moreover, in the imaging magnets of the present invention, light is generated directly in the bore, for example by LEDs embedded in the body coil former, or through thin film technology such as organic or inorganic electroluminescent displays embedded in, or applied to a radially outer surface of, the body coil former.

While the prior art provides various arrangements for introducing light into the bore tube with the patient, each of the known arrangements reduces the available space for the patient within the bore tube.

As is well known in the art, space within a bore tube should be maximized to improve patient comfort. Light generating means known for illuminating the bore tube are intended to relieve a patient's feelings of confinement. Reducing the actual space available within the patient bore by providing such light generating means partially defeats the object of providing the light. Conversely, an increase in bore tube diameter to accommodate the light provision equipment of the prior art would require a corresponding increase in the size of the magnet, which would be economically prohibitive.

The present invention therefore provides arrangements for increasing the apparent internal dimensions of the patient bore, without reducing the actual space within the patient bore.

In an embodiment of the invention, a translucent resin may be used for moulding the body coil, with a light source such as LEDs embedded within the structure of the body coil assembly such that a separate looks cover is no longer needed within the bore, the resin itself serving as the body coil former.

In particular embodiments, transparent, translucent or opalescent plastic body coil formers are provided with embedded light sources such as LEDs to maximize apparent bore diameter.

According to an aspect of the invention, the body coil former 28 is of a transparent or translucent material, for example polycarbonate or an organic resin. Glass-reinforced plastic (GRP), comprising thin filaments of glass within an organic resin, may be found to be suitable. The presence of the glass fibers may provide a useful diffusion effect.

In an embodiment of the invention, illustrated in FIG. 4, a translucent body coil former 28 has light sources, such as light emitting diodes (LEDs) embedded therein. A radially inner surface 28a (FIGS. 3A, 3B) may be observed by a patient undergoing treatment within the patient bore. The radially inner surface 28a of the body coil former may itself be exposed to the patient bore 25, or a transparent or translucent "looks" cover may be provided, radially inside the body coil former. FIG. 4 schematically illustrates a part of a body coil assembly according to such an embodiment. In the embodiment shown in FIG. 4, a number of LEDs 34 are arranged, embedded within the material of the body coil former 28, over a substantial radial and axial proportion of the body coil former. The former itself is transparent or translucent, at least in a radial portion 28b extending between the light source and an inner surface of the former. It is usually preferred that the light from LEDs 34 will be diffused before entering the patient bore, to produce the effect of a substantially constant lighting level rather than a number of point sources. The required diffuse effect may be provided by making the body coil former of a translucent, rather than transparent, material. Alternatively, the body coil former 28 may be made of a transparent material, while a diffusing surface treatment is applied to the radially inner surface 28a of the body coil former, for example a frosted coating or surface treatment, texturing or a paint layer. Production of the body coil former of FIG. 4 may proceed by the following method. An inner portion 28b of the body coil former may first be produced as a solid cylinder. This may be of a transparent or translucent material such as glass, polycarbonate, organic resin or a fiber reinforced plastic. A matrix of light sources such as LEDs 34 may then be arranged on the radially outer surface of the inner portion 28b. The light sources may be carried on a plastic supporting mesh, for example, to assist in positioning and retaining the light sources. Suitable electrical connections will also be provided, preferably incorporated into the supporting mesh, for example. The resultant assembly may then be placed into a mold and a setting material 28c, such as a thermosetting organic resin, optionally reinforced with glass or other fibers, is introduced into the mold to embed the light sources and to bond them to the inner portion. Once hardened, the resultant structure may be used as a body coil former, as described.

In the embodiment of FIG. 4, the body coil former 28 need have a thickness t no greater than that of body coil formers of the prior art. As it is generally desired that a patient will see the radially inner surface 28a of the body coil former, there is no need to provide a "looks" cover to disguise the body coil former. In this way, no space within the patient bore is consumed in the provision of a light source—on the contrary, an enlargement of the bore may result due to no looks cover being required.

Concerns over the aesthetics of a visible body coil former can be addressed by painting, frosting or otherwise applying a translucent coating or treatment to the radially inner surface of the body coil former. In such embodiments, the patient will see the coating or treatment applied to the radially inner surface. In a solenoidal magnet arrangement, the apparent internal diameter of the bore will be increased by twice the thickness of the "looks" cover—12 mm in a typical example—at a relatively insignificant cost.

Further embodiments include the use of thin film displays as light sources to generate lighting effects within the bore. Such thin films include Electroluminescent Displays (ELDs), such as are presently available for lighting industrial display panels, bendable screens, and road signs. Similarly, organic electroluminescent display thin film technology could also be used—offering potential for lower voltage performance. Both organic and inorganic thin films are capable of operation within a high magnetic field environment, since they are effectively just lossy capacitors.

In other embodiments, organic or inorganic electroluminescent display thin film technology is used to generate lighting effects to maximise apparent bore diameter. Such arrangements may also serve to optically screen the body coil from the patient, with a potential further use for providing cognitive stimulation.

Figure 5:
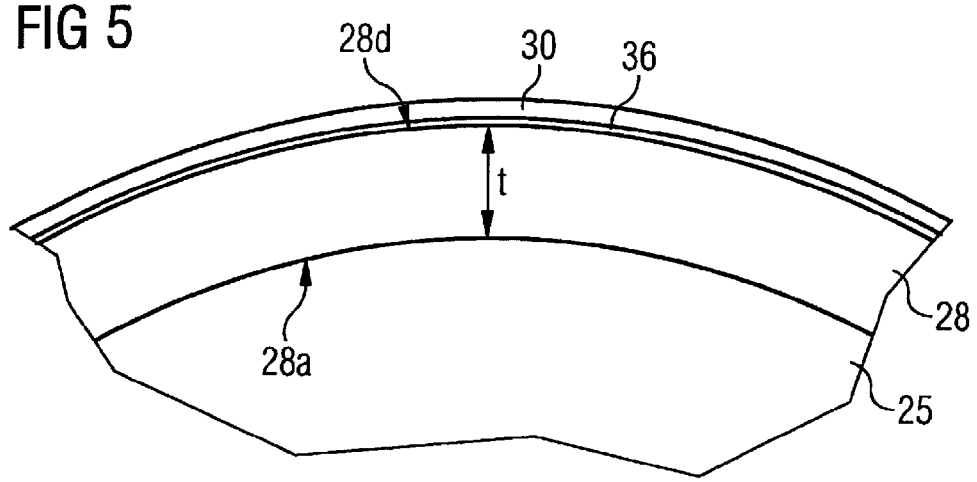

FIG. 5 illustrates another body coil assembly according to an embodiment of the prior art. In this embodiment, the light source is an electroluminescent display 36, radially positioned between the body coil former 28 and the coils 30 themselves. In such arrangement, the light source 36 is not embedded into the material of the body coil former 28, but rather is retained on the radially outer surface 28d of the body coil former, radially within the coils 30. The material of the body coil former 28 may be transparent, for example being of glass or polycarbonate, enabling a patient to clearly observe the electroluminescent display 36, for example to enable the patient to receive messages or view images displayed on the electroluminescent display 36. Alternatively, the body coil former may be of a translucent material, or may have a diffusing coating applied to radially inner 28a or radially outer 28d surface, to provide a diffuse light to a patient. Alternatively, diffusing material, such as a translucent layer, may be provided within an otherwise transparent body coil former.

Alternatively, the body coil former may be made of two or more concentric layers, at least one of which is translucent, the remaining layers being translucent or transparent.

High frequency filters may be provided on electrical supply lines to reduce the effect of high frequency fields during imaging. Furthermore, in addition to simply increasing the apparent internal diameter of the patient bore to pacify patients, such thin film light sources could also be used to stimulate patients during cognitive studies by displaying suitable images.

The presently most easily achieved electroluminescent colour with the highest light output is believed to be a blue/green colour. A sample of flexible electroluminescent film has already been tested in the bore of a 3 T imaging magnet system and demonstrated operation in a magnetic field of 3 T, with no detectable change in performance.

In certain embodiments, the body coil former 28 may be made of a certain combination of concentric layers in order to enhance the optical performance of the light sources provided according to the present invention. For example, a radially outer layer may be of translucent material, and may contain at least one embedded light source, while a radially inner layer may be transparent. When observed by a patient, the patient will see an inner surface of the translucent radially outer layer, and should not notice the transparent radially inner layer at all. The apparent internal bore radius will be increased by the thickness of the transparent layer Since the thickness t of the body coil former is generally dictated by the need to separate the patient bore from the body coils 30 by a certain distance, rather than structural concerns, the thickness t of the body coil former may be reduced by a radial thickness of the electroluminescent display 36, so as to maintain the thickness of the body coil assembly 30, 28, 36 as a whole equal to the thickness of a conventional body coil assembly not provided with a light source of the present invention. In this way, no space within the patient bore is consumed in the provision of a light source—on the contrary, an enlargement of the bore may result due to no looks cover being required.

In construction of the body coil assembly of FIG. 5, the electroluminescent display 36 may be adhesively bonded to the body coil former with a transparent or translucent adhesive layer. Alternatively, the electroluminescent display 36 may be retained in position by the coils 30 themselves.

In alternative embodiments, an electroluminescent display 36 may be embedded within the material of the body coil former, in a manner similar to that illustrated in FIG. 4.

While electroluminescent displays have particularly been described, other types of thin-film display may be employed in embodiments of the present invention.

Preferably, the light source used, such as LEDs or a thin-film display, is capable of generating light of a variety of colours. The colour of light provided to a patient may be controlled, for example in order to inform or warn the patient as to the progress of a treatment, or to provide required stimuli to the patient. Electrical voltages or other signals applied to the body coil may be employed to determine a colour, intensity or other characteristic of light provided into the patient bore.

In a further alternative embodiment of the present invention, the body coil former includes a photoluminescent material, such as Strontium Aluminate, with a light source being directed at parts of the body coil former which may be observed by a patient undergoing treatment. For example, a light source may be provided near the bottom of the patient bore, in a location which will be under the patient table 26 when in use (consider FIG. 2). Operation of the light source will "energise" the photoluminescent material, so that it will glow when a patient is positioned within the patient bore.

The body coil former may be made of a certain combination of concentric layers, at least one of which includes a photoluminescent material. Other light sources such as LEDs or thin film displays may be used in conjunction with photoluminescent material, to offer a compound optical effect, if desired.

In some embodiments of the present invention, optical fibres may be provided within the material of the bore tube former, to assist in distribution of light across the radially inner surface 28a of the body coil former.

In some embodiments of the present invention, the body coils 30 may be embedded within the material of the body coil former 28. In such arrangements, the light sources of the present invention may also be embedded within the material of the body coil former 28—either radially inside the coils or, if the coils are sufficiently open, radially level with or outside the coils.

Although modifications and changes may be suggested by those skilled in the art, it is the intention of the inventors to embody within the patent warranted heron all changes and modifications as reasonably and properly come within the scope of their contribution to the art.

We claim as our invention:

1. An MRI imaging magnet having a patient bore configured for receiving a human or animal patient, comprising a body coil assembly located inside said patient bore, said body coil assembly comprising
    a body coil former comprised of
        coil former material and having a radially inner surface that faces the patient, and
        having a body coil supported by said coil former material,
    said body coil assembly also having at least one source of light incorporated within the body coil assembly and embedded in the body coil former material, that radiates light into the patient bore, with said at least one source of light not mechanically protecting into said bore beyond said radially inner surface of the coil former, and
    said at least one light source of light being located between said body coil and said radially inner surface of the coil former.

2. An MRI imaging magnet according to claim 1 wherein the body coil former is of a translucent or opalescent material.

3. An MRI imaging magnet according to claim 1 wherein the body coil former material is a transparent material.

4. An MRI imaging magnet according to claim 3 wherein a translucent treatment or coating is applied to said radially inner surface of the body coil former.

5. An MRI imaging magnet according to claim 1 wherein the source of light comprises a light emitting diode (LED) with a translucent or opalescent layer located between the LED and the patient bore.

6. An MRI imaging magnet according to claim 1 wherein the least one source of light comprises at least one thin film display.

7. An MRI imaging magnet according to claim 6 wherein the thin film display is an electroluminescent display.

8. An MRI imaging magnet according to claim 1 wherein the least one source of light comprises a photoluminescent material.

9. An MRI imaging magnet according to claim 1 comprising optical fibers within the material of the bore tube former.

10. An MRI imaging magnet according to claim 1 wherein said at least one source of light comprises at least one thin film display retained on a radially outer surface of said body coil former, and disposed radially within said body coil.

11. An MRI imaging magnet having a patient bore configured for receiving a human or animal patient, comprising a body coil assembly within the bore of the magnet that receives the patient within the body coil assembly, the body coil assembly comprising translucent material and a body coil embedded in said translucent material, and a source of light also embedded in the translucent material, said source of light radiating light that proceeds through said translucent material in order to make the radiated light visible in the patient bore.

12. An MRI imaging magnet according to claim 11 wherein the source of light comprises a light emitting diode (LED) with a translucent or opalescent layer located between the LED and the patient bore.

13. An MRI imaging magnet according to claim 11 wherein the least one source of light comprises at least one thin film display.

14. An MRI imaging magnet according to claim 13 wherein the thin film display is an electroluminescent display.

15. An MRI imaging magnet according to claim 11 wherein the least one source of light comprises a photoluminescent material.

16. An MRI imaging magnet according to claim 11 comprising optical fibers within the material of the bore tube former.

* * * * *